United States Patent
Penney et al.

(10) Patent No.: US 10,789,996 B2
(45) Date of Patent: *Sep. 29, 2020

(54) SHIFTING DATA IN SENSING CIRCUITRY

(71) Applicant: Micron Technology, Inc., Boise, ID (US)

(72) Inventors: Daniel B. Penney, Wylie, TX (US); Harish N. Venkata, Allen, TX (US); Guy S. Perry, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/360,685

(22) Filed: Mar. 21, 2019

(65) Prior Publication Data

US 2019/0221244 A1    Jul. 18, 2019

Related U.S. Application Data

(63) Continuation of application No. 15/978,578, filed on May 14, 2018, now Pat. No. 10,242,722, which is a
(Continued)

(51) Int. Cl.
*G11C 7/10* (2006.01)
*G11C 11/4096* (2006.01)
*G11C 11/4091* (2006.01)

(52) U.S. Cl.
CPC .......... *G11C 7/1006* (2013.01); *G11C 7/1036* (2013.01); *G11C 11/4091* (2013.01); *G11C 11/4096* (2013.01); *G11C 2211/4013* (2013.01)

(58) Field of Classification Search
CPC .............. G11C 7/1006; G11C 11/4096; G11C 2241/4013; G11C 11/4091; G11C 7/1036
See application file for complete search history.

(56) References Cited

U.S. PATENT DOCUMENTS

| 4,380,046 A | 4/1983 | Fung |
| 4,435,792 A | 3/1984 | Bechtolsheim |

(Continued)

FOREIGN PATENT DOCUMENTS

| CN | 102141905 | 8/2011 |
| EP | 0214718 | 3/1987 |

(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.
(Continued)

*Primary Examiner* — Tri M Hoang
(74) *Attorney, Agent, or Firm* — Brooks, Cameron & Huebsch, PLLC

(57) ABSTRACT

The present disclosure includes apparatuses and methods related to shifting data. An example apparatus comprises sensing circuitry including a sense amplifier and a compute component having a first storage location and a second storage location associated therewith. A controller is coupled to the sensing circuitry. The controller is configured to control an amount of power associated with shifting a data value stored in the first storage location to the second storage location by applying a charge sharing operation.

21 Claims, 4 Drawing Sheets

Related U.S. Application Data continuation of application No. 15/216,440, filed on Jul. 21, 2016, now Pat. No. 9,972,367.

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |

(56) References Cited

U.S. PATENT DOCUMENTS

| | | |
|---|---|---|
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,767,864 B1 | 9/2017 | Penney et al. |
| 9,966,116 B2 | 5/2018 | Penney et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1* | 3/2015 | Cowles ............... G11C 11/4091 365/189.12 |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2016/0308513 A1* | 10/2016 | Park ..................... G09G 3/3688 |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |

(56) References Cited

FOREIGN PATENT DOCUMENTS

| WO | 2001065359 | 9/2001 |
|---|---|---|
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

"4.9.3 Minloc and Maxloc", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory As a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

\* cited by examiner

SHIFTING DATA IN SENSING CIRCUITRY

PRIORITY INFORMATION

This application is a Continuation of U.S. application Ser. No. 15/978,578, filed May 14, 2018, which issues as U.S. Pat. No. 10,242,722 on Mar. 26, 2019, which is a Continuation of U.S. application Ser. No. 15/216,440, filed Jul. 21, 2016, which issued as U.S. Pat. No. 9,972,367 on May 15, 2018, the contents of which are included herein by reference.

TECHNICAL FIELD

The present disclosure relates generally to semiconductor memory and methods, and more particularly, to apparatuses and methods related to shifting data in sensing circuitry.

BACKGROUND

Memory devices are typically provided as internal, semiconductor, integrated circuits in computing systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources (e.g., one or more processors), which may retrieve and execute instructions and store the results of the executed instructions to a suitable location. A processing resource can comprise a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and division on operands via a number of logical operations.

A number of components in a computing system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and data may also be sequenced and/or buffered.

In many instances, the processing resources (e.g., processor and/or associated functional unit circuitry) may be external to the memory array, and data is accessed via a bus between the processing resources and the memory array to execute a set of instructions. Processing performance may be improved in a processing-in-memory (PIM) device, in which a processing resource may be implemented internal and/or near to a memory (e.g., directly on a same chip as the memory array). A PIM device may reduce time in processing and may also conserve power. Data movement between and within arrays and/or subarrays of various memory devices, such as PIM devices, can affect processing time and/or power consumption.

DETAILED DESCRIPTION

Figure 1:
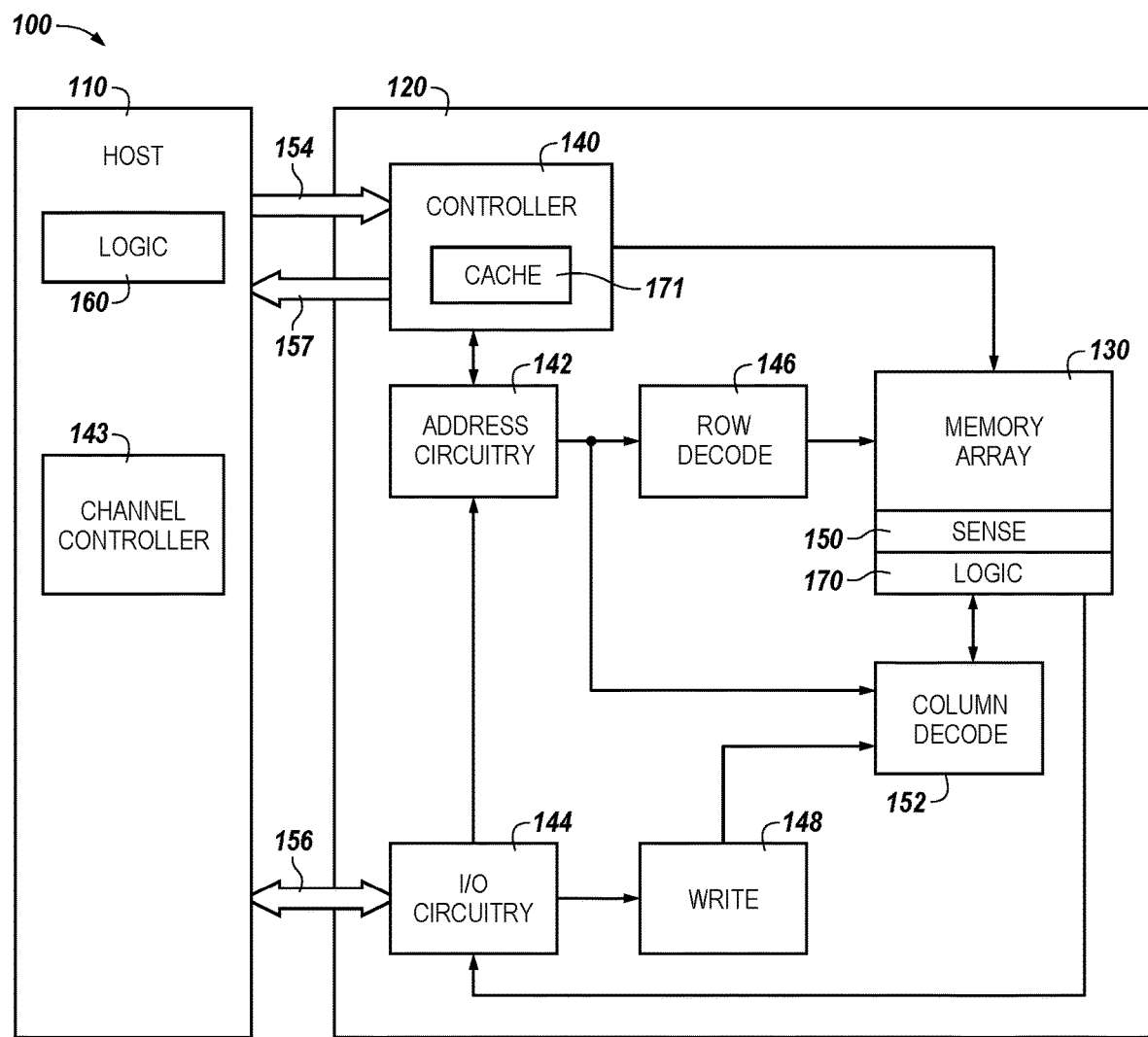
FIG. 1 is a block diagram of an apparatus in the form of a computing system including a memory device in accordance with a number of embodiments of the present disclosure.

The present disclosure includes apparatuses and methods related to shifting data in sensing circuitry. An example apparatus comprises sensing circuitry configured to shift data. The sensing circuitry includes a sense amplifier and a compute component having a first storage location and a second storage location associated therewith. A controller is coupled to the sensing circuitry. The controller is configured to control an amount of power associated with shifting a data value stored in the first storage location to the second storage location by applying a charge sharing operation. In some embodiments, shifting data includes shifting data between single-bit sensing circuitry in a memory. As used herein, a "sensing circuitry" includes a sense amplifier and a compute component having a first storage location and a second storage location. In some embodiments first and second storage locations can each include a latch.

Shifting data in a memory device can consume more power than other memory device operations. In some examples, shifting data can consume up to four times as much power as other memory device operations. Embodiments of the present disclosure seek to reduce the amount of power consumed in shifting data in a memory device. For example, a number of embodiments of the present disclosure can facilitate shifting data in sensing circuitry in a more efficient manner as compared to previous approaches. Embodiments include implementing various charge sharing techniques in novel shift circuit architectures, for example, circuit architectures including sensing circuitry associated with a PIM device. An example method includes moving a data value stored in sensing circuitry, the sensing circuitry including a sense amplifier and a compute component having a first storage location and a second storage location associated therewith, where moving the data value includes applying a charge sharing operation between the first storage location and the second storage location within the compute component. Some embodiments may include isolating capacitances in particular nodes associated with the shift circuit architectures. By applying these charge sharing techniques and/or by isolating capacitances in particular nodes, a reduction in power associated with shifting data can be realized in comparison with some approaches.

In some embodiments, each discrete collection of elements that comprise sensing circuitry may be referred to as a "sensing circuitry element." For example, a sense amplifier, Boolean logic, an accumulator storage location, and a shift storage location, when taken together, may be referred to as a "sensing circuitry element." In some embodiment, sensing circuitry element may be connected to another sensing circuitry element such that data values (e.g., bits) may be moved (e.g., shifted) from one sensing circuitry element to another sensing circuitry element. Shifting data values between one sensing circuitry element and another sensing circuitry element may be done synchronously such that a sensing circuitry element receives a data value from another sensing circuitry element as the sensing circuitry element passes its data value to yet another sensing circuitry element. In some embodiments, shifting data in sensing circuitry can facilitate various processing functions such as the multiplication, addition, etc. of two operands.

In some approaches, data that is shifted data in sensing circuitry has been stored using a dynamic capacitance associated with a latch on which the data value is stored. Notably, embodiments of the present disclosure may alleviate lost charge, leaked charge, and/or charge coupling, that may affect storing data values using dynamic capacitance, by providing more than one storage location per sensing circuitry element. For example, some embodiments can allow for shifting data in sensing circuitry without depending upon (or relying on) dynamic capacitance, and instead may allow for data values to be actively held (e.g., latched).

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "n", particularly with respect to reference numerals in the drawings, indicate that a number of the particular feature so designated can be included. As used herein, "a number of" a particular thing refers to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 150 may reference element "50" in FIG. 1, and a similar element may be referenced as 250 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, controller 140, channel controller 143, memory array 130, sensing circuitry 150, logic circuitry 170, and/or cache 171 might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines, which may be referred to herein as word lines or select lines, and columns coupled by digit lines, which may be referred to herein as data lines or sense lines. Although a single array 130 is shown in FIG. 1, embodiments are not so limited. For instance, memory device 120 may include a number of arrays 130 (e.g., a number of banks of DRAM cells, NAND flash cells, etc.).

The memory device 120 includes address circuitry 142 to latch address signals for data provided over a data bus 156 (e.g., an I/O bus) through I/O circuitry 144. Status and/or exception information can be provided from the controller 140 on the memory device 120 to a channel controller 143, through a high speed interface (HSI) including an out-of-band bus 157, which in turn can be provided from the channel controller 143 to the host 110. Address signals are received through address circuitry 142 and decoded by a row decoder 146 and a column decoder 152 to access the memory array 130. Data can be read from memory array 130 by sensing voltage and/or current changes on the digit lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 can be used to write data to the memory array 130.

Controller 140 (e.g., memory controller) decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110 and sequencing access to the array 130. The controller 140 can be a state machine, sequencer, or some other type of controller, and include hardware and/or firmware (e.g., microcode instructions) in the form of an application specific integrated circuit (ASIC).

In some embodiments, the controller 140 may include cache 171. The controller 140 can control, for example, generation of clock signals and application of the clock signals to a compute component in sensing circuitry in association with shifting data in accordance with embodiments described herein.

As described further below, in a number of embodiments, the sensing circuitry 150 can comprise a sense amplifier and a compute component. The compute component may also be referred to herein as an accumulator, and can be used to perform logical operations (e.g., on data associated with complementary digit lines). According to various embodiments, the compute component comprises a first storage location and a second storage location, also referred to as shift latches. The first and second storage locations of the compute components can serve as stages of a shift register. For example, clock signals can be applied to the compute components to shift data between the first and second storage locations and to an adjacent compute component.

In a number of embodiments, the sensing circuitry 150 can be used to perform logical operations using data stored in array 130 as inputs and/or store the results of the logical operations back to the array 130 without transferring data via a digit line address access (e.g., without firing a column decode signal). As such, various compute functions can be performed using, and within, sensing circuitry 150 rather than (or in association with) being performed by processing resources external to the sensing circuitry (e.g., by a processing resource associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150. The sensing circuitry 150 can be formed on pitch with the memory cells of the array. Additional logic circuitry 170 can be coupled to the sensing circuitry 150 and can be used to store (e.g., cache and/or buffer) results of operations described herein.

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth consumption of such an external processing resource).

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to performing logical operations using sensing circuitry (e.g., 150) without enabling column decode lines of the array. Whether or not local I/O lines are used in association with performing logical operations via sensing circuitry 150, the local I/O line(s) may be enabled in order to transfer a result to a suitable location other than back to the array 130 (e.g., to an external register).

Figure 2:
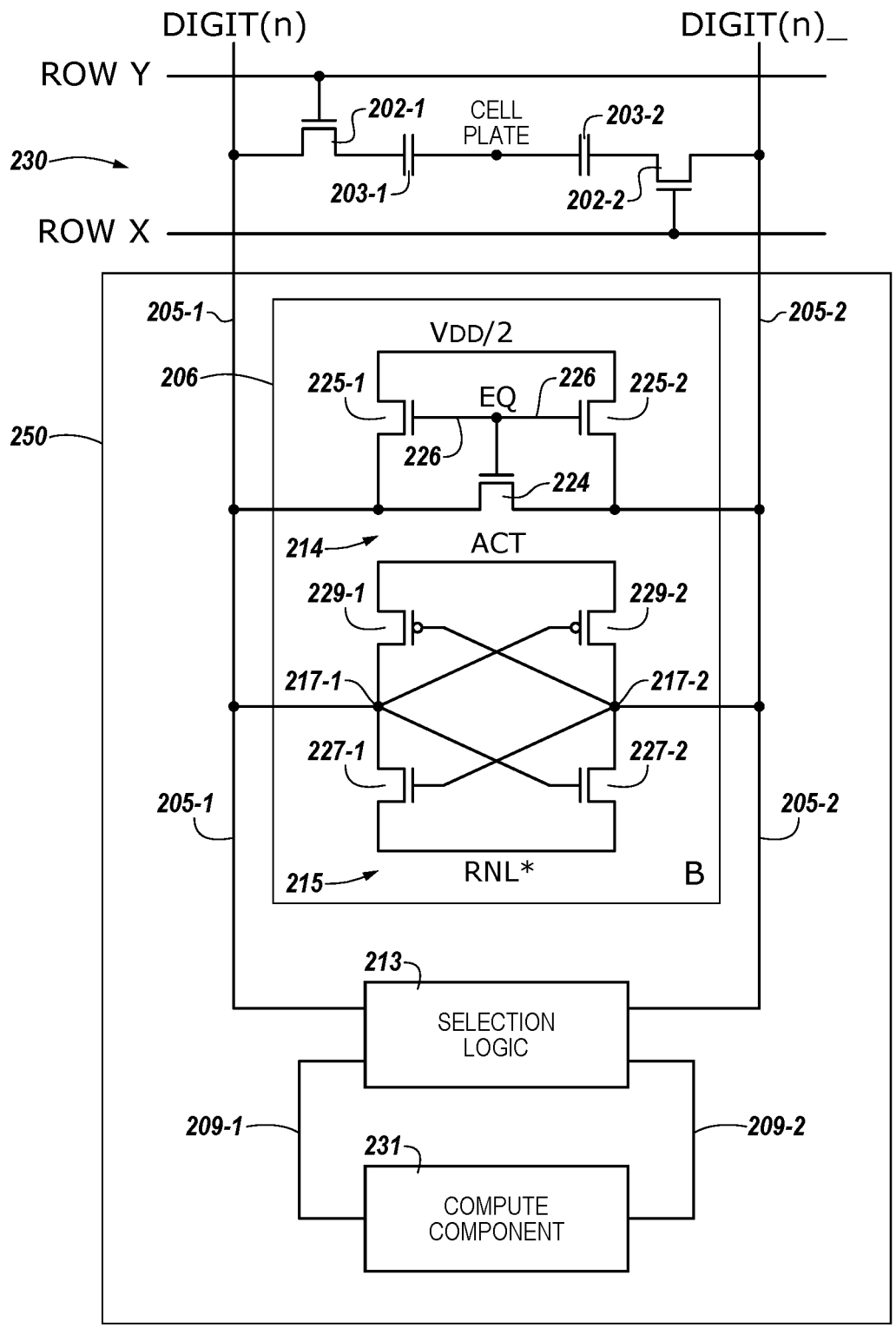
FIG. 2 is a schematic diagram of a portion of a memory array including sensing circuitry in accordance with a number of embodiments of the present disclosure.

FIG. 2 is a schematic diagram illustrating a portion of a memory array 230 including sensing circuitry in accordance with a number of embodiments of the present disclosure. FIG. 2 illustrates one sensing component 250 which can be one of a number of sensing components corresponding to sensing circuitry 150 shown in FIG. 1. In the example shown in FIG. 2, the memory array 230 is a DRAM array of 1T1C (one transistor one capacitor) memory cells in which a transistor serves as the access device and a capacitor serves as the storage element; although other embodiments of configurations can be used (e.g., 2T2C with two transistors and two capacitors per memory cell). In this example, a first memory cell comprises transistor 202-1 and capacitor 203-1, and a second memory cell comprises transistor 202-2 and capacitor 203-2, etc.

The cells of the memory array 230 can be arranged in rows coupled by access lines 204-X (Row X), 204-Y (Row Y), etc., and columns coupled by pairs of complementary digit lines (e.g., digit lines 205-1 labelled DIGIT(n) and 205-2 labelled DIGIT(n)_in FIG. 2). Although only one pair of complementary digit lines are shown in FIG. 2, embodiments of the present disclosure are not so limited, and an array of memory cells can include additional columns of memory cells and complementary digit lines (e.g., 4,096, 8,192, 16,384, etc.).

Memory cells can be coupled to different digit lines and word lines. For instance, in this example, a first source/drain region of transistor 202-1 is coupled to digit line 205-1, a second source/drain region of transistor 202-1 is coupled to capacitor 203-1, and a gate of transistor 202-1 is coupled to word line 204-Y. A first source/drain region of transistor 202-2 is coupled to digit line 205-2, a second source/drain region of transistor 202-2 is coupled to capacitor 203-2, and a gate of transistor 202-2 is coupled to word line 204-X. A cell plate, as shown in FIG. 2, can be coupled to each of capacitors 203-1 and 203-2. The cell plate can be a common node to which a reference voltage (e.g., ground) can be applied in various memory array configurations.

The digit lines 205-1 and 205-2 of memory array 230 are coupled to sensing component 250 in accordance with a number of embodiments of the present disclosure. In this example, the sensing component 250 comprises a sense amplifier 206 and a compute component 231 corresponding to a respective column of memory cells (e.g., coupled to a respective pair of complementary digit lines). The sense amplifier 206 is coupled to the pair of complementary digit lines 205-1 and 205-2. The sense amplifier 206 is coupled to the selection logic 213. The compute component 231 is coupled to the selection logic 213 via accumulator signal lines 209-1 and 209-2. As used herein, "selection logic" can include operation selection logic, for example, logic configured to perform Boolean logic operations. The selection logic 213 can be coupled to the pair of complementary digit lines 205-1 and 205-2 and configured to perform logical operations on data stored in array 230.

The sense amplifier 206 can be operated to determine a data value (e.g., logic state) stored in a selected memory cell. The sense amplifier 206 can comprise a cross coupled latch 215 (e.g., gates of a pair of transistors, such as n-channel transistors 227-1 and 227-2 are cross coupled with the gates of another pair of transistors, such as p-channel transistors 229-1 and 229-2), which can be referred to herein as a primary latch. However, embodiments are not limited to this example.

In operation, when a memory cell is being sensed (e.g., read), the voltage on one of the digit lines 205-1 or 205-2 will be slightly greater than the voltage on the other one of digit lines 205-1 or 205-2. An ACT signal and an RNL* signal can be driven low to enable (e.g., fire) the sense amplifier 206. The digit line 205-1 or 205-2 having the lower voltage will turn on one of the transistors 229-1 or 229-2 to a greater extent than the other of transistors 229-1 or 229-2, thereby driving high the digit line 205-1 or 205-2 having the higher voltage to a greater extent than the other digit line 205-1 or 205-2 is driven high.

Similarly, the digit line 205-1 or 205-2 having the higher voltage will turn on one of the transistors 227-1 or 227-2 to a greater extent than the other of the transistors 227-1 or 227-2, thereby driving low the digit line 205-1 or 205-2 having the lower voltage to a greater extent than the other digit line 205-1 or 205-2 is driven low. As a result, after a short delay, the digit line 205-1 or 205-2 having the slightly greater voltage is driven to the voltage of the supply voltage VDD through a source transistor, and the other digit line 205-1 or 205-2 is driven to the voltage of the reference voltage (e.g., ground) through a sink transistor. Therefore, the cross coupled transistors 227-1 and 227-2 and transistors 229-1 and 229-2 serve as a sense amplifier pair, which amplify the differential voltage on the digit lines 205-1 and 205-2 and operate to latch a data value sensed from the selected memory cell.

Embodiments are not limited to the sensing component configuration illustrated in FIG. 2. As an example, the sense amplifier 206 can be a current-mode sense amplifier and/or a single-ended sense amplifier (e.g., sense amplifier coupled to one digit line). Also, embodiments of the present disclosure are not limited to a folded digit line architecture such as that shown in FIG. 2.

In this example, the sense amplifier 206 includes equilibration circuitry 214, which can be configured to equilibrate the digit lines 205-1 and 205-2. The equilibration circuitry 214 comprises a transistor 224 coupled between digit lines 205-1 and 205-2. The equilibration circuitry 214 also comprises transistors 225-1 and 225-2 each having a first source/drain region coupled to an equilibration voltage (e.g., VDD/2), where VDD is a supply voltage associated with the array. A second source/drain region of transistor 225-1 is coupled to digit line 205-1, and a second source/drain region of transistor 225-2 is coupled to digit line 205-2. Gates of transistors 224, 225-1, and 225-2 can be coupled together and to an equilibration (EQ) control signal line 226. As such, activating EQ enables the transistors 224, 225-1, and 225-2, which effectively shorts digit lines 205-1 and 205-2 together and to the equilibration voltage (e.g., VDD/2). Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

Figure 3:
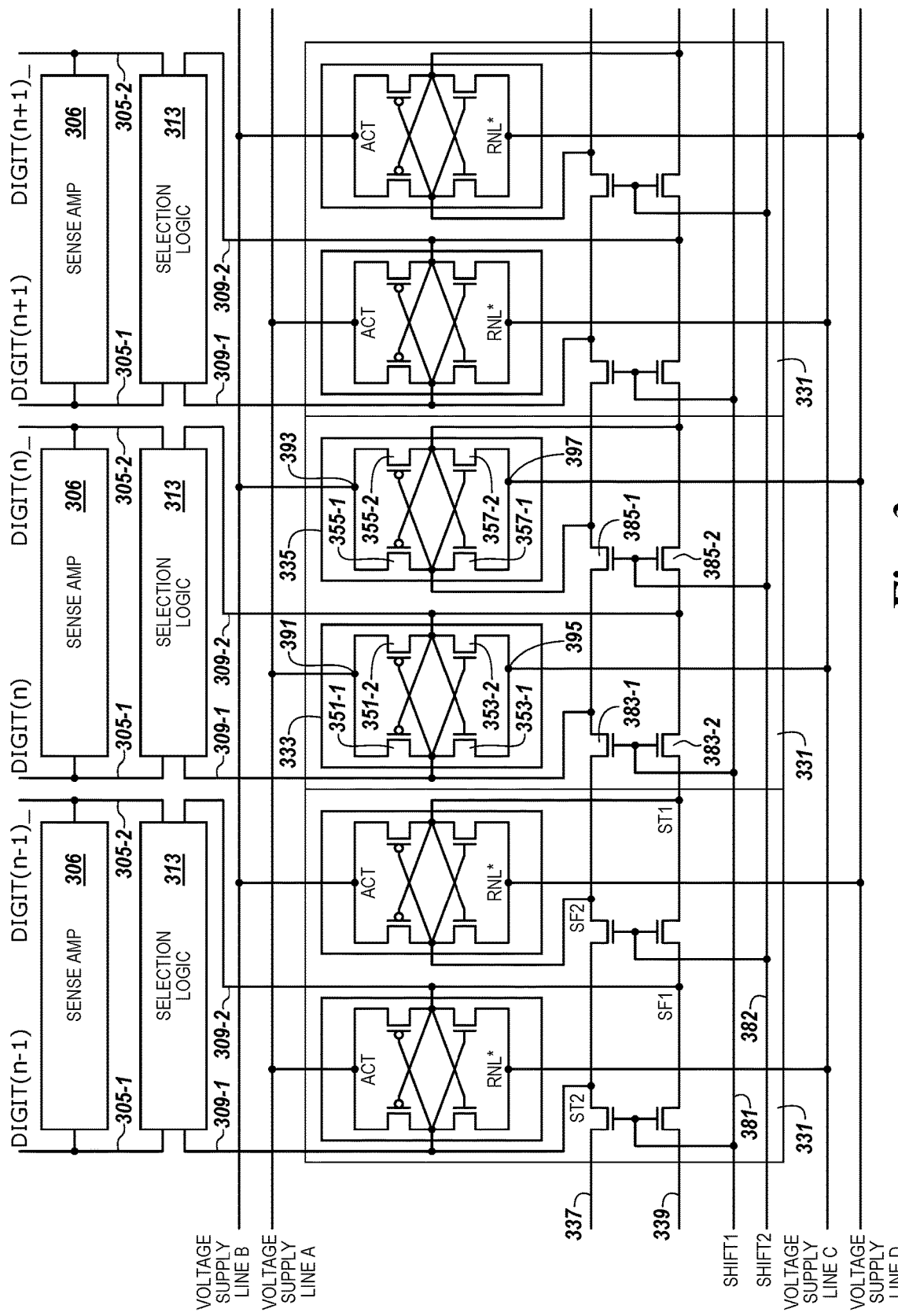
FIG. 3 is a schematic diagram illustrating sensing circuitry in accordance with a number of embodiments of the present disclosure.

FIG. 3 is a schematic diagram illustrating sensing circuitry in accordance with a number of embodiments of the present disclosure. FIG. 3 shows a number of sense amplifiers 306 coupled to respective pairs of complementary digit lines 305-1 and 305-2, and a corresponding number of compute components 331 coupled to the sense amplifiers 306. The sense amplifiers 306 and compute components 331 shown in FIG. 3 can correspond to sensing circuitry 150 shown in FIG. 1, for example. The sensing circuitry shown in FIG. 3 includes selection logic 313, which can be operated as described further herein. The selection logic 313 shown in FIG. 3 can correspond to selection logic 213 shown in FIG. 2, for example.

Although not shown, memory cells, such as those described in FIG. 2, are coupled to the pairs of complementary digit lines 305-1 and 305-2 The cells of the memory array can be arranged in rows coupled by word lines and columns coupled by pairs of complementary digit lines DIGIT(n−1)/DIGIT(n−1)_, DIGIT(n)/DIGIT(n)_, DIGIT(n+1)/DIGIT(n+1)_, etc. The individual digit lines corresponding to each pair of complementary digit lines can also be referred to as data lines. Although only three pairs of complementary digit lines (e.g., three columns) are shown in FIG. 3, embodiments of the present disclosure are not so limited.

As shown in FIG. 3, the sensing components can comprise a sense amplifier 306, a compute component 331, and logical operation selection logic 313 corresponding to respective columns of memory cells (e.g., coupled to respective pairs of complementary digit lines). The sense amplifier 306 can comprise, for example, a cross coupled latch, which can be referred to herein as a primary latch. The sense amplifiers 306 can be configured, for example, as described with respect to FIG. 2.

A data value present on the pair of complementary digit lines 305-1 and 305-2 can be loaded into the corresponding compute component 331. In some embodiments, the compute component 331 can include a pair of storage locations (e.g., first storage location 333 and second storage location 335) associated with each compute component 331. The first storage location 333 and the second storage location 335 can comprise stages of a shift register. For example, in at least one embodiment, the storage locations (e.g., first storage location 333 and second storage location 335) associated with compute components 331 can serve as respective stages of a shift register capable of shifting data values (e.g., right and/or left) and/or performing rotation operations (e.g., rotate right and/or rotate left). As an example, the data values can be loaded into the storage locations of a corresponding compute component 331 by overwriting of the data values currently stored in the storage locations of the corresponding compute components 331 with a data value stored in the corresponding sense amplifier 306. The data value on the pair of complementary digit lines 305-1 and 305-2 can be the data value stored in the sense amplifier 306 when the sense amplifier is enabled (e.g., fired).

In the example illustrated in FIG. 3, the circuitry corresponding to compute components 331 can be configured as a shift register. For example, each compute component 331 comprises a first storage location 333, which may be referred to herein as a first secondary latch, and a second storage location 335, which may be referred to herein as a second secondary latch. Each compute component 331 can further comprise a number of additional transistors operable to transfer (e.g., shift) data values right and/or left (e.g., to a first or second storage location of an adjacent compute component 331).

In some embodiments, a first latching/activation signal ACT is applied to the two p-channel transistors 351-1 and 351-2 of the first storage location 333 and a second latching/activation signal RNL* is applied to the two n-channel transistors 353-1 and 353-2 of the second storage location 335. Similarly, a second ACT signal is applied to the two p-channel transistors 355-1 and 355-2 of the second storage location 335 and a second RNL* signal is applied to the two n-channel transistors 357-1 and 357-2 of the second storage location 335. In some embodiments, the respective ACT and RNL* signals control operation of the first storage location 333 and the second storage location 335. As shown in FIG. 3, power to the first storage location 333 and the second storage location 335 can be provided via voltage supply line A and voltage supply line C, and voltage supply line B and voltage supply line D, respectively. For example, first storage location 333 is coupled to voltage supply line A at power node 391, and second storage location is coupled to voltage supply line B at power node 393. First storage location 333 is coupled to voltage supply line C via power node 395, and second storage location 335 is coupled voltage supply line D via power node 397. Although not shown in FIG. 3, a power supply transistor can be coupled to each of the voltage supply lines A-D and a reference voltage (e.g., Vdd).

As shown in FIG. 3, signal input lines 337 and 339 are coupled to respective accumulator signal lines 309-1 and 309-2. In operation, the voltage on one of the signal input lines 337 or 339 will be slightly greater than the voltage on one of the other signal input lines 337 or 339. The signal input line 337 or 339 having the lower voltage will turn on one of the p-channel transistors 351-1 or 351-2 in the first secondary latch (e.g., first storage location 333) to a greater extent than the other of p-channel transistors 351-1 or 351-2, thereby driving higher the accumulator signal line 309-1 or 309-2 having a higher voltage to a greater extent than the other accumulator signal line 309-1 or 309-2 is driven high. Similarly, the signal input line 337 or 339 having the lower voltage will turn on one of the p-channel transistors 355-1 or 355-2 in the second secondary latch (e.g., second storage location 335) to a greater extent than the other of transistors 355-1 or 355-2, thereby driving higher the accumulator signal line 309-1 or 309-2 having a higher voltage to a greater extent than the other accumulator signal line 309-1 or 309-2 is driven high.

The signal input line 337 or 339 having the higher voltage will turn on one of the n-channel transistors 353-1 or 353-2 in the first secondary latch to a greater extent than the other of the transistors 353-1 or 353-2, thereby driving lower the accumulator signal line 309-1 or 309-2 having the lower voltage to a greater extent than the other accumulator signal line 309-1 or 309-2 is driven low. Similarly, the signal input line 337 or 339 having the higher voltage will turn on one of the n-channel transistors 357-1 or 357-2 in the second secondary latch to a greater extent than the other of the transistors 357-1 or 357-2, thereby driving lower the accumulator signal line 309-1 or 309-2 having the lower voltage to a greater extent than the other accumulator signal line 309-1 or 309-2 is driven low. Accordingly, as used herein, a "high side" or "high node," and a "low side" or "low node" of the first storage location 333 and/or the second storage location 335 refer to a side of the storage location on which a differential voltage is comparatively high or comparatively low, respectively.

The first and second sampling transistors 383-1 and 383-2 can be controlled by a shift signal. For example, an input of first storage location 333 can be coupled to the first and second sampling transistors 383-1 and 383-2, and an input of second storage location 335 can be coupled to the third and fourth sampling transistors 385-1 and 385-2. In some embodiments, the first and second sampling transistors 383-1 and 383-2 and/or the third and fourth sampling transistors 385-1 and 385-2 can control storing and/or shifting of data values between the first storage location 333 and the second storage location 335.

In some embodiments, the first and second sampling transistors 383-1 and 383-2 and/or the third and fourth sampling transistors 385-1 and 385-2 may be enabled or disabled in response to a control signal. For example, the first and second sampling transistors 383-1 and 383-2 may be enabled or disabled in response to a SHIFT 1 control signal line 381, and the third and fourth sampling transistors 385-1 and 385-2 may be enabled or disabled in response to a SHIFT 2 control signal line 382, as described in more detail, herein. The SHIFT 1 control signal line 381 can carry a shift right phase 2, left phase 1 control signal, and the SHIFT 2 control signal line 382 can carry a shift right phase 1, left phase 2 control signal.

In some embodiments, shifting data from the first storage location 333 to the second storage location 335 is carried out by controlling which of power nodes 391, 393, 395, and 397 are providing a voltage to each of the first storage location 333 and the second storage location 335 over time. For example, shifting data from the first storage location 333 to the second storage location 335 can include applying a voltage to first storage location at power nodes 391 and/or 395 when a voltage is not applied to second storage location 335 at power nodes 393 and/or 397, and synchronously switching the applied voltages such that the voltage is no longer applied to first storage location 333 at power nodes 391 and/or 395 and the voltage is instead applied to second storage location 335 at power nodes 393 and/or 397. In some embodiments, the first and second sampling transistors 383-1 and 383-2 and/or the third and fourth sampling transistors 385-1 and 385-2 may be enabled when the voltage is switched from power node 391 and/or 395 to power node 393 and/or 397, or vice versa. In some embodiments, the first storage location 333 and/or the second storage location 335 are equalized when their respective power node 391/395 or 393/397 is not receiving a voltage signal.

The first storage location 333 and the second storage location 335 can each operate in at least three stages. A first stage of operation can include an equalization stage in preparation for receiving a differential input signal. In some embodiments, the differential input signal can be received from signal input lines 337 and/or 339. A second stage of operation can include a sample stage in which the differential input signal is received by the first storage location 333 and/or the second storage location 335. For example, a data value can be received and/or stored by the first storage location 333 and/or the second storage location 335 based on the differential input signal on accumulator signal lines 309-1 and 309-2. A third stage of operation can include an "amplify and latch" stage where the received differential input signal is amplified and latched by the first storage location 333 and/or the second storage location 335.

In some embodiments, the third stage can be facilitated by cross coupled transistors 353-1 and 353-2, and 351-1 and 351-2 associated with the first storage location 333, which can amplify the differential voltage on signal input lines 337 and 339 and operate to latch a data value received at the first storage location 333. Similarly, coupled transistors 357-1 and 357-2, and 355-1 and 355-2 associated with the second storage location 335, can amplify the differential voltage on signal input lines 337 and 339 and operate to latch a data value received at the second storage location 335. In some embodiments, the third stage can include driving the data value from one storage location to a next storage location (e.g., driving the data value from the first storage location 333 to the second storage location 335).

In some embodiments, an amount of power consumed in shifting data between the storage locations (e.g., first storage location 333 and second storage location 335) can be reduced as compared to some approaches through the use of various charge sharing operations, as describe in more detail, herein.

For example, an additional stage of operation may be added to the first storage location 333 and/or the second storage location 335. In this embodiment, one storage location may operate as a driving storage location (e.g., the first storage location 333), and another storage location may act as a receiving storage location (e.g., the second storage location 335). The power may be disabled to the driving storage location (e.g., the power on the high side), and the power may be enabled to the receiving storage location such that a charge on a high node (e.g., node SF1) associated with the driving storage location is shared with the receiving storage location via node SF2. In some embodiments, this transfer of charge between the driving storage location and the receiving storage location may assist in developing a different signal magnitude (e.g., a signal split) at the receiving storage location than at the driving storage location in the absence of any additional external power. In some embodiments, this charge sharing operation may reduce power consumption associated with shifting data by up to fifteen percent (e.g., a reduction of power consumption of 5 Amps versus a "worst case" power consumption of 30 Amps).

In some embodiments, a charge sharing operation may be applied during the equalization stage of one or more of the storage locations. For example, power to both the high side and the low side may be disabled, and the high side signal charge may be shared with the low side. In operation, this can lead to the resulting voltage between the initially higher side and the initially lower side to equalize in the case where the capacitance on both sides is equal. In some embodiments, this can result in the initially lower side having a higher voltage value (e.g., a logic value of 1) in the absence of additional external power. Notably, the equalization voltage between the initially higher side and the initially lower side may be offset if the capacitances on both sides are not equal.

In some embodiments, a charge sharing operation may include shorting the high side power node (e.g., node SF1, which is coupled to voltage supply line A) of the driving storage location to the high side node (e.g., node ST1, which is coupled to voltage supply line B) of the receiving storage location after a signal split has developed on the receiving storage location. For example, the high side node of the driving storage location may be shorted to the high side node of the receiving storage location when the receiving storage location is in the third stage (e.g., the amplify and latch stage). In some embodiments, shorting the high side node SF1 of the driving storage location to the high side node ST1 of the receiving storage location can be accomplished by adding shorting devices (not shown) in gaps where the high side power drivers are located. In some embodiments, this charge sharing operation may reduce power consumption associated with shifting data by up to fifteen percent (e.g., a reduction of power consumption of 5 Amps versus a "worst case" power consumption of 30 Amps).

In some embodiments, a charge sharing operation may include disabling digit lines 305-1 and 305-2 after the first storage location 333 and the second storage location 335 have received the differential input signal. In operation, this can be achieved by using selection logic 313 to decouple (e.g., short, gate, etc.) accumulator signal lines 309-1 and 309-2 from compute component 331. For example, although the compute components 331 are coupled to the selection logic 313 circuit to provide processor functionality, once a data value has been received by the first storage location 333 and/or the second storage location 335, digit lines 305-1 and 305-2 that couple the compute components 331 to the selection logic 313 are not required for shifting data between the storage locations of the compute components or for shifting data between compute components 331. In some embodiments, however, the selection logic 313 and/or sense amps 306 can provide a capacitive load to the compute components 331.

In some embodiments, this capacitive load can be reduced by gating the selection logic 313 such that gates associated with the selection logic 313 are pulled low (e.g., to zero) after data values have been received by the first storage location 333 and the second storage location 335 associated with compute component 331. In this regard, the capacitive load associated with selection logic 313 may be isolated from the compute components 331 to reduce an amount of power consumed in shifting data among the storage locations 333/335, and/or compute components 331.

Although not shown in FIG. 3, each column of memory cells can be coupled to a column decode line that can be activated to transfer, via a local I/O line, data values from corresponding sense amplifiers 306 and/or compute components 331 to a control component external to the array such as an external processing resource (e.g., host processor and/or other functional unit circuitry). The column decode line can be coupled to a column decoder. However, as described herein, in a number of embodiments, data need not be transferred via such I/O lines to perform shift operations in accordance with embodiments of the present disclosure. In a number of embodiments, shift circuitry can be operated in conjunction with sense amplifiers 306 and compute components 331 to perform shift operations without transferring data to a control component external to the array, for instance. As used herein, transferring data, which may also be referred to as moving data or shifting data is an inclusive term that can include, for example, copying data from a source location to a destination location and/or moving data from a source location to a destination location without necessarily maintaining a copy of the data at the source location.

As noted above, the first storage location 333 and the second storage location 335 associated with the compute components 331 can be operated to shift data values left or right from one compute component 331 to another compute component 331. In this example, the first storage location 333 of each compute component 331 is coupled to a corresponding pair of complementary digit lines 305-1/305-2, with a low side power node (e.g., node ST2, which is coupled to voltage supply line C) being coupled to the particular digit line (e.g., DIGIT(n−1)) communicating a "true" data value and with node SF1 being coupled to the corresponding complementary digit line (e.g., DIGIT (n−1)_) communicating the complementary data value (e.g., "false" data value). The second storage location 335 is coupled to the first storage location 333 via signal input lines 337 and 339 with a low side power node (e.g., node SF2, which is coupled to voltage supply line D) being coupled to a particular signal input line (e.g., signal input line 337) and node ST1 being coupled to a particular signal input line (e.g., signal input line 339).

An example of shifting data right according to the disclosure can include operating control signal lines 381 and 382 to move data values right from a first storage location 333 associated with one compute component 331 through the first and second sampling transistors 383-1 and 383-2 to a second storage location 335 associated with the compute component 331. For example, activation of control signal 382 causes the data from node SF1 to move right through the third and fourth sampling transistors 385-1 and 385-2 to node ST1 of a right-adjacent compute component 331. Subsequent activation of control signal line 381 causes the data from node ST1 to move through the first and second sampling transistors 383-1 and 383-2 right to node SF1, which completes a right shift by one compute component 331. Data can be "bubbled" to the left/right by repeating the left/right shift sequence multiple times. Data values can be latched (and prevented from being further shifted) by maintaining control signal line 381 activated and control signal line 382 deactivated (e.g., such that feedback is enabled for the respective compute component latches and such that the respective latches are isolated from each other). In a number of embodiments, the control signals SHIFT 1 and/or SHIFT 2 on control signal lines 381 and 382, respectively, can be shift clock signals such as those described below. As an example, although signals SHIFT 1 and SHIFT 2 are identified on the left side of FIG. 3, the signals can be initiated on either end of the sensing circuitry in accordance with a number of embodiments described herein. For example, in association with shifting data leftward via the compute components 331, clock signals associated with shifting the data can be initiated on the rightmost end of the array and can be propagated leftward. In a similar manner, in association with shifting data rightward via the compute components 331, clock signals associated with shifting the data can be initiated on the leftmost end of the array and can be propagated rightward.

Embodiments of the present disclosure are not limited to the shifting capability described in association with the compute components 331. For example, a number of embodiments can include shift circuitry in addition to and/or instead of the shift circuitry described in association with a shift register.

Figure 4:
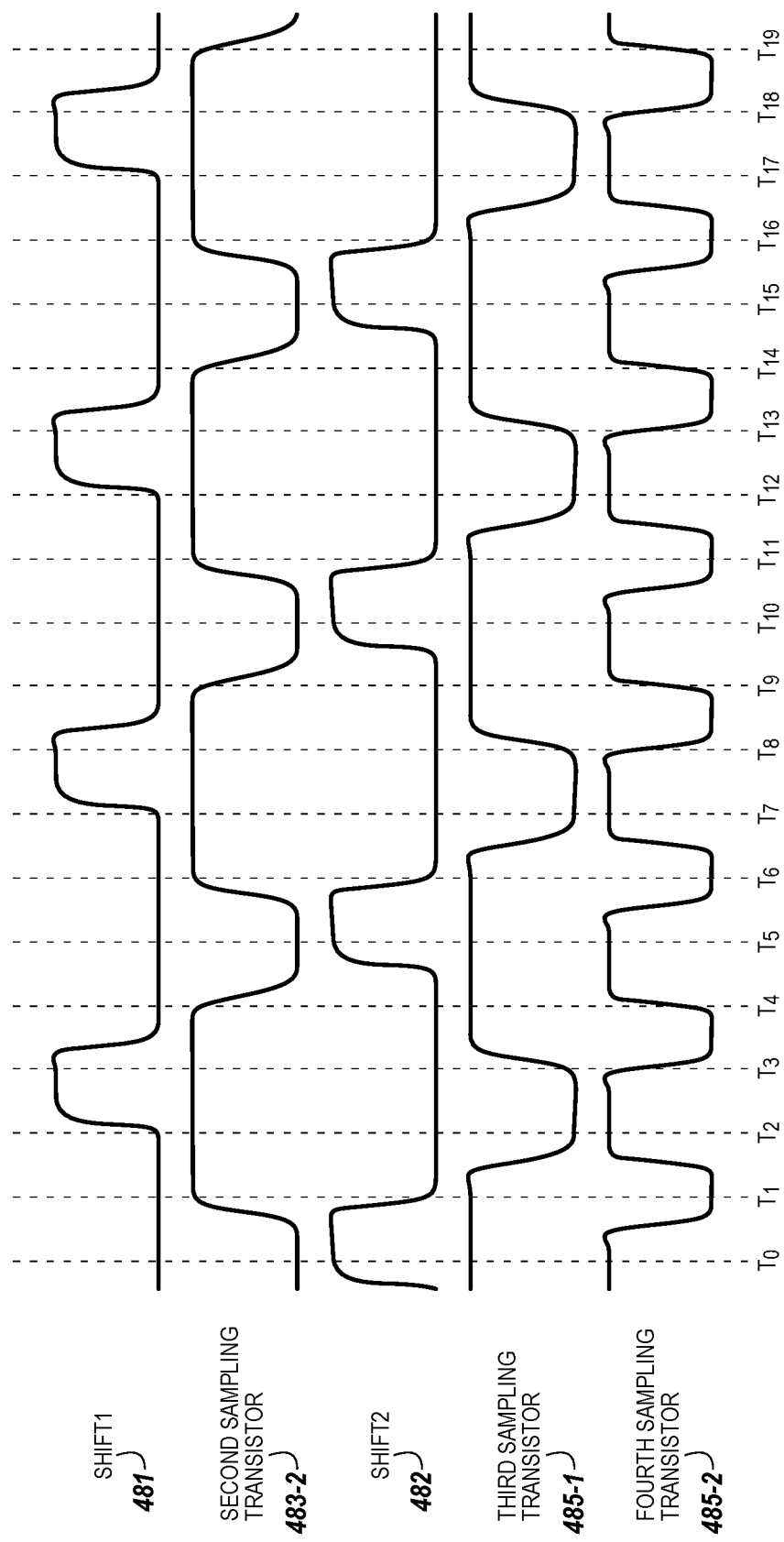
FIG. 4 is a timing diagram including shift signals, power gates, and a charge sharing gate according to the disclosure.

FIG. 4 is a timing diagram including shift signals, and behavior of power gates, and a charge sharing gate according to the disclosure. In the example of FIG. 4, SHIFT 1 signal 481 and SHIFT 2 signal 482 associated with shifting data are illustrated in addition to the behavior of the second sampling transistor 483-2, the third sampling transistor 485-1, and the fourth sampling transistor 485-2 as the shift signals are applied.

As illustrated in FIG. 4, SHIFT 2 signal 477 may be driven high while SHIFT 1 signal 475 is low. In this example, first storage location power gate 483-2 is initially low, while the third sampling transistor 485-1 and the fourth sampling transistor 485-2 are initially high. The SHIFT 2 signal 477 can subsequently driven low and the SHIFT 1 signal 475 can be driven high.

When the SHIFT 2 signal 477 low and the SHIFT 1 signal 475 is high, a voltage can be applied to the second sampling transistor 483-2 and/or a voltage can be disabled to the third sampling transistor 485-1. Data values can be shifted between a first storage location and a second storage location based on when the SHIFT 2 signal 477 and SHIFT 1 signal 475 are high and low. For example, a data value can be shifted (e.g., rightward) from the first storage location to the second storage location when the SHIFT 2 signal 477 goes high as the SHIFT 1 signal 475 goes low. In order to shift a data value the opposite direction (e.g., leftward) the operation of the shift signals can be reversed. For example, a data value can be shifted leftward when the SHIFT 2 signal 477 goes low as the SHIFT 1 signal 475 goes high. In some embodiments, enabling (e.g., driving high) the SHIFT 2 signal 477 and/or the SHIFT 1 signal 475 can include applying a voltage to one or more of the storage locations in the compute components.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a compute component having a first storage location and a second storage location; and
   a controller coupled to the compute component and configured to:
      enable a first shift signal while a second shift signal is disabled to shift a data value from the first storage location to the second storage location;
      disable the first shift signal; and
      enable the second shift signal while the first shift signal is disabled to shift the data value from the second storage location to a third storage location.

2. The apparatus of claim 1, wherein the controller is configured to:
   enable the first shift signal during a first clock cycle; and
   disable the first shift signal and enable the second shift signal during a second clock cycle.

3. The apparatus of claim 1, wherein the controller is configured to:
   apply a first voltage to the first storage location when the first shift signal is enabled; and
   apply a second voltage to the second storage location when the second shift signal is enabled.

4. The apparatus of claim 1, wherein the controller is configured to:
disable the first shift signal; and
cause a node associated with the first storage location to be shorted to a node associated with the second storage location in response to the first shift signal being disabled.

5. The apparatus of claim 1, wherein the controller is configured to disable a power signal to the first storage location or the second storage location such that a charge associated with the first storage location or the second storage location is shared with the other of the first storage location or the second location.

6. The apparatus of claim 1, wherein the controller is configured to disable a first storage location power signal to the first storage location in response to a second storage location power signal being enabled.

7. The apparatus of claim 1, wherein the controller is part of a processing in memory device.

8. A method, comprising:
enabling a first shift signal while a second shift signal is disabled to shift a data value from a first storage location to a second storage location associated with a compute component of a sensing circuitry;
disabling the first shift signal; and
enabling the second shift signal while the first shift signal is disabled to shift the data value from the second storage location to a third storage location.

9. The method of claim 8, further comprising:
enabling the first shift signal during a first clock cycle; and
disabling the first shift signal and enabling the second shift signal during a second clock cycle.

10. The method of claim 8, further comprising disabling a first storage location power signal to the first storage location in response to enabling a second storage location power signal.

11. The method of claim 8, further comprising sharing a charge between the first storage location and the second storage location by disabling the second shift signal in response to disabling the first shift signal.

12. The method of claim 8, further comprising coupling a node of the first storage location to a node of the second storage location such that the node of the second storage location is shorted to the node of the first storage location.

13. The method of claim 8, further comprising disabling a power signal to the first storage location or the second storage location such that a charge associated with the first storage location or the second storage location is shared with the other of the first storage location or the second location.

14. A system, comprising:
a host coupled to a memory array;
sensing circuitry coupled to the array and comprising a compute component having a first storage location and a second storage location; and
a controller coupled to the array and the compute component, wherein the controller is configured to:
enable a first shift signal while a second shift signal is disabled to shift a data value from the first storage location to the second storage location;
disable the first shift signal; and
enable the second shift signal while the first shift signal is disabled to shift the data value from the second storage location to a third storage location.

15. The system of claim 14, wherein the controller is configured to disable a power signal to the first storage location or the second storage location such that a charge associated with the first storage location or the second storage location is shared with the other of the first storage location or the second location.

16. The system of claim 14, wherein the controller is configured to control gating a node associated with a selection logic element coupled to the sensing circuitry such that the selection logic element is isolated from the first storage location and the second storage location as part of the charge sharing operation.

17. The system of claim 14, wherein the controller is configured to control coupling a node of the first storage location to a node of the second location such that the node of the first storage location is shorted to the node of the second location.

18. The system of claim 14, wherein the controller is further configured to shift the data value from the first storage location to the second storage location.

19. An apparatus, comprising:
a compute component having a first storage location and a second storage location; and
a controller coupled to the compute component and configured to:
enable, during a first clock cycle, a first shift signal while a second shift signal is disabled to shift a data value from the first storage location to the second storage location;
disable, during a second clock cycle, the first shift signal; and
enable, during the second clock cycle, the second shift signal while the first shift signal is disabled to shift the data value from the second storage location to a third storage location.

20. An apparatus, comprising:
a compute component having a first storage location and a second storage location; and
a controller coupled to the compute component and configured to:
enable a first shift signal while a second shift signal is disabled to shift a data value from the first storage location to the second storage location;
apply a first voltage to the first storage location when the first shift signal is enabled;
disable the first shift signal;
enable the second shift signal while the first shift signal is disabled to shift the data value from the second storage location to a third storage location; and
apply a second voltage to the second storage location when the second shift signal is enabled.

21. An apparatus, comprising:
a compute component having a first storage location and a second storage location; and
a controller coupled to the compute component and configured to:
enable a first shift signal while a second shift signal is disabled to shift a data value from the first storage location to the second storage location; and
disable a first storage location power signal to the first storage location in response to a second storage location power signal being enabled.

* * * * *